United States Patent
Tokushige et al.

(10) Patent No.: US 6,329,288 B1
(45) Date of Patent: Dec. 11, 2001

(54) SEMICONDUCTOR DEVICE AND MANUFACTURING METHOD THEREOF

(75) Inventors: Ryoji Tokushige; Nobuyuki Takai; Hiroyuki Shinogi; Yukihiro Takao, all of Gunma (JP)

(73) Assignee: Sanyo Eelctric Co., Ltd., Osaka (JP)

( * ) Notice: Subject to any disclaimer, the term of this patent is extended or adjusted under 35 U.S.C. 154(b) by 0 days.

(21) Appl. No.: 09/489,709

(22) Filed: Jan. 24, 2000

(30) Foreign Application Priority Data

Jan. 25, 1999 (JP) .................................................. 11-015953
Feb. 5, 1999 (JP) .................................................. 11-029029

(51) Int. Cl.⁷ .................................................. H01L 21/44
(52) U.S. Cl. .......................... 438/675; 438/690; 438/694; 438/723; 438/743
(58) Field of Search ..................... 438/675, 690, 438/694, 723, 743; 24/121.64, 840

(56) References Cited

U.S. PATENT DOCUMENTS 5,829,125 * 11/1998 Fujimoto et al. ....................... 29/840
5,914,274 * 6/1999 Yamaguchi et al. .................. 438/690

* cited by examiner

Primary Examiner—David Nelms
Assistant Examiner—Reneé R Berry
(74) Attorney, Agent, or Firm—Fish & Richardson P.C.

(57) ABSTRACT

A process of exposing the head of a metal post used with a chip size package is simplified. A first semiconductor manufacturing method comprising the steps of forming an insulating resin layer R so as to completely cover the top of a metal post 8 and then polishing the resin layer so as to expose the head of the metal post, and a second semiconductor manufacturing method comprising the steps of forming an insulating resin layer R so as to completely cover the top of the metal post 8, then back grinding the wafer rear face, and then polishing the resin layer R so as to expose the head of the metal post are provided.

13 Claims, 8 Drawing Sheets

SEMICONDUCTOR DEVICE AND MANUFACTURING METHOD THEREOF

BACKGROUND OF THE INVENTION

1. Field of the Invention

This invention relates to a semiconductor device of chip-size package type and a manufacturing method therefore. The chip-size package (CSP) is a generic name for packages of a size equal to or slightly larger than the chip size and is a package intended for high-density packaging. The invention relates to a metal post adopted for the CSP and resin for covering the metal post.

2. Description of the Related Art

Hitherto, in the field, a structure having a plurality of solder balls arranged like a plane, called a BGA (Ball Grid Array), a structure whose outside shape is close to the chip size by making the ball pitch of the BGA narrower, called a fine-pitch BGA, any another other structure have been known.

In recent years, a wafer CSP described in the 1998 August issue of "Nikkei Microdevice" p.44–p. 71 has been available. This wafer CSP basically is a CSP comprising wiring and array-like pad manufactured in a wafer process (preprocess) before chip dicing. It is expected that the technology makes it possible to combine the wafer process and a package process (postprocess) into one for drastically reducing package costs.

The wafer CSPs are classified into those of seal resin type and those of rewiring type. The wafer CSP of the seal resin type has a structure with a surface coated with seal resin, like that of a conventional package, wherein a metal post is formed on a wiring layer on the chip surface and is surrounded by seal resin for fixture.

Generally, it is said that if a package is mounted on a printed wiring board, a stress generated because of the thermal expansion difference between the package and the printed wiring board concentrates on a metal post; however, in the wafer CSP of the seal resin type, it is considered that the stress is scattered because the metal post lengthens.

Figure 10:
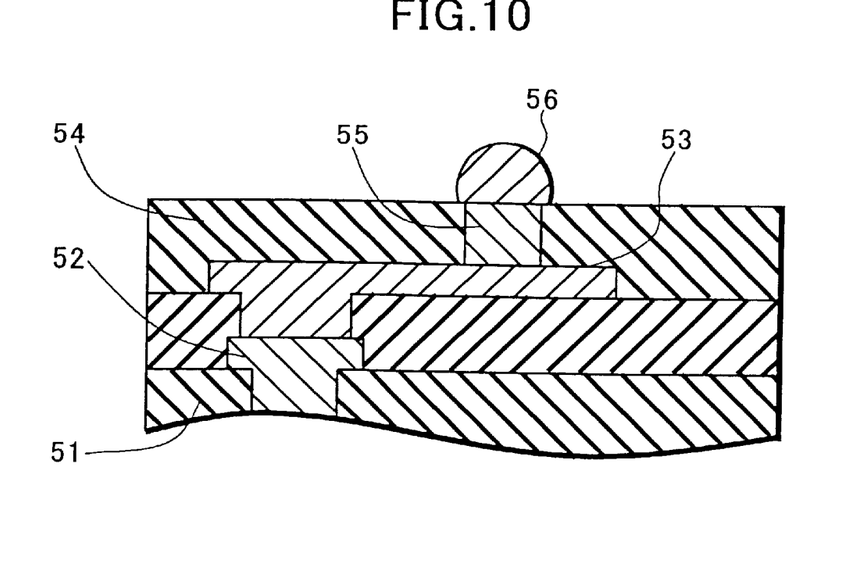
FIG. 10 is a drawing to describe a chip size package in a related art.

On the other hand, the wafer CSP of the rewiring type has a structure wherein rewiring is formed without using seal resin, as shown in FIG. 10. That is, an Al electrode 52, a wiring layer 53, and an insulating layer 54 are deposited on the surface of a chip 51, a metal post 55 is formed on the wiring layer 53, and a solder bump(solder ball) 56 is formed on the metal post 55. The wiring layer 53 is used as rewiring for placing the solder balls 56 in a manner of a predetermined array on the chip.

The wafer CSP of the seal resin type provides high reliability by lengthening the metal post about 100 $\mu$m and reinforcing the metal post with seal resin. However, the seal resin forming process needs to be executed with a metal mold (die) in the post process and the process becomes complicated.

On the other hand, the wafer CSP of the rewiring type has the advantages that the process is comparatively simple and moreover most steps can be executed in the wafer process. However, the stress needs to be relieved for enhancing the reliability by some method.

Figure 11:
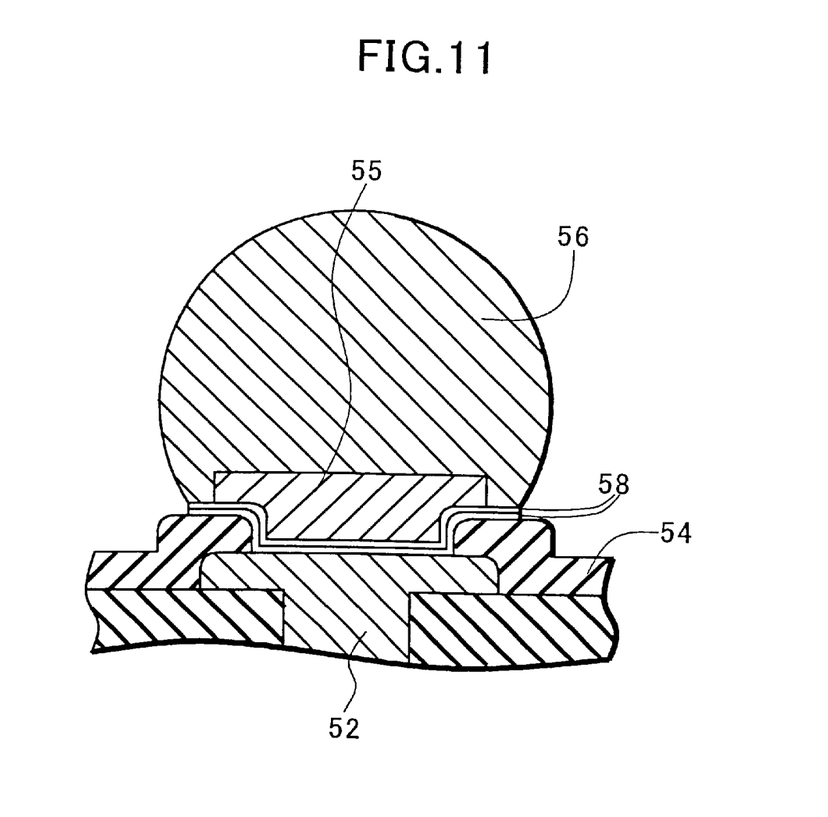
FIG. 11 is a drawing to describe the chip size package in the related art.

FIG. 11 is a drawing provided by omitting the wiring layer 53 in FIG. 10. The Al electrode 52 forms an exposed opening formed with at least one layer of barrier metal 58 between the metal post 55 and the Al electrode 52, and the solder ball 56 is formed on the metal post 55.

The formation step of the insulating layer 54 sealed with resin for covering the surroundings of the metal post 55 is executed as described below.

However, in FIG. 10, the insulating layer 54 is formed of resin, thus voids are formed in the abutment part of the metal post 55.

Figure 12:
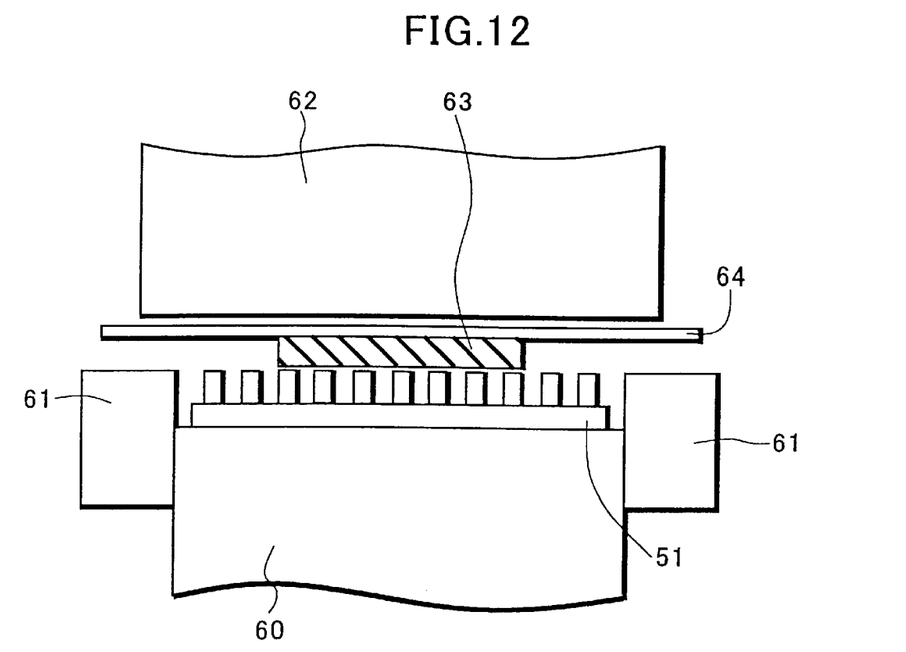
FIG. 12 is a drawing to describe semiconductor device manufacturing method using metal mold.

That is, as shown in FIG. 12, resin 63 is entered in metal mold 60, 61, 62 and is pressurized and fused. Semiconductor chips 51 are placed in the metal mold in a state in which a large number of metal posts 55 are upright, and the resin 63 is pressed by the metal mold and the wafer full face is covered with the resin 63.

Numeral 64 denotes a sheet for peeling off the resin 63 from the metal mold.

However, the resin does not arrive at the edges of the surroundings of the abutment part of the metal post 55 and its lower layer and voids (black dots in the figure) are easily formed. Therefore, moisture resistance is reduced, environmental resistance worsens, or explosion occurs due to heat of external atmosphere or the element itself, destroying the element.

Figure 13:
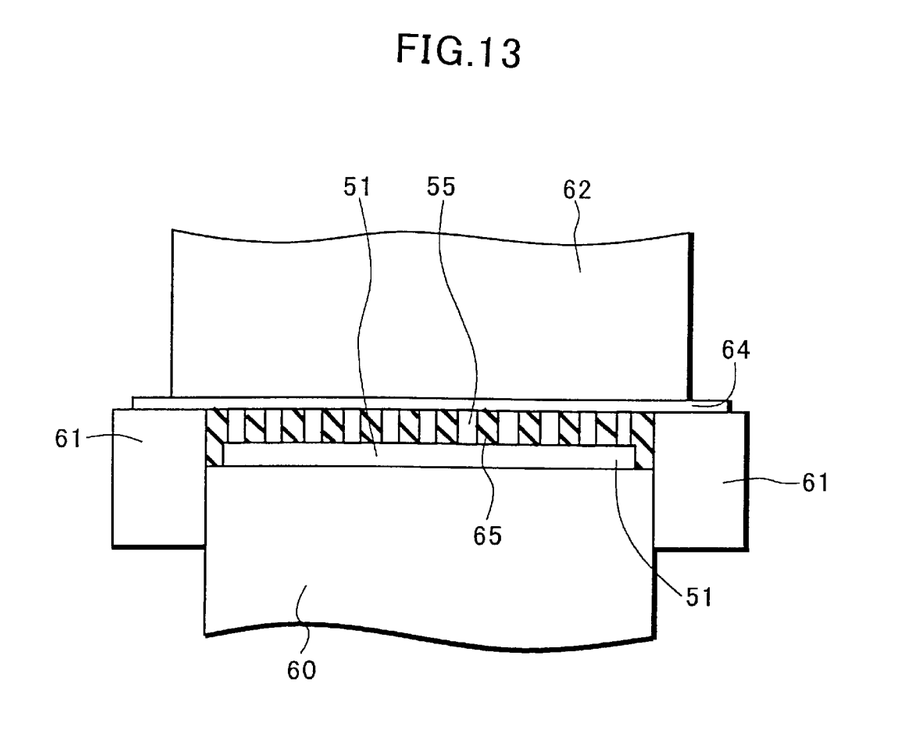
FIG. 13 is a drawing to describe semiconductor device manufacturing method using metal mold.

At the time, as shown in FIG. 13, control is performed so as to expose the head of the metal post 55 when resin sealing is executed (the sheet 64 is peeled), thus process control is complicated. That is, it is very difficult to control variations in the heights of the metal posts 55, and it is also necessary to finely control the amount of the resin 63 for sealing (containing a contraction coefficient), etc. Further, it is also necessary to consider selection of the sheet 64 for peeling off (containing elasticity).

SUMMARY OF THE INVENTION

It is therefore a first object of the invention to prevent formation of voids for preventing moisture resistance and environmental resistance from being reduced.

It is a second object of the invention to suppress variations in the heights of metal posts for providing a high-reliability CSP structure.

A first aspect of the invention is characterized by the fact that after a resin layer R is formed so as to completely cover the top of a metal post 8, the resin layer R is polished so as to expose the head of the metal post 8.

A second aspect of the invention is characterized by the fact that after a resin layer R is formed so as to completely cover the top of a metal post 8, the wafer rear face is back ground and then the resin layer R is polished so as to expose the head of the metal post 8.

A third aspect of the invention is characterized by the fact that the resin layer R formed so as to completely cover the top of the metal post is about 20 $\mu$m to 50 $\mu$m. thick above the top of the metal post 8.

A fourth aspect of the invention is characterized by the fact that the resin layer R formed so as to completely cover the top of the metal post is a mold resin sealed using a metal mold.

A fifth aspect of the invention is characterized by the fact that the resin layer R formed so as to completely cover the top of the metal post is spin-coated polyimide.

A sixth aspect of the invention is characterized by the fact that the resin layer R formed so as to completely cover the top of the metal post is a liquid epoxy family resin.

A seventh aspect of the invention is characterized by the fact that the resin layer R formed so as to completely cover the top of the metal post is an amic acid family polyimide film laminated.

According to an eighth aspect of the invention, there is provided a semiconductor device comprising a metal post contacted to an electrode of LSI, resin covering surroundings of the metal post, and a solder ball or a solder bump connected to the metal post, characterized in that a coat is provided for smoothing the edges formed in the surroundings of the abutment part of the metal post and its lower layer.

A ninth aspect of the invention is characterized by the fact that the coat is further provided between a resin layer for covering side walls surrounding a chip and edge formed at side wall bottom.

A tenth aspect of the invention is characterized by the fact that the coat covers an interface exposed to the side wall.

An eleventh aspect of the invention is characterized by the fact that a wiring layer made of metal abuts a bottom layer part of the metal post and the coat is put on the edges formed in the surroundings of the abutment part of the wiring layer and its bottom layer part.

A twelfth aspect of the invention is characterized by the fact that the coat is a film formed by spin coating.

DESCRIPTION OF THE PREFERRED EMBODIMENT

Referring now to the accompanying drawings, there is shown a preferred embodiment of the invention.

Figure 8A:
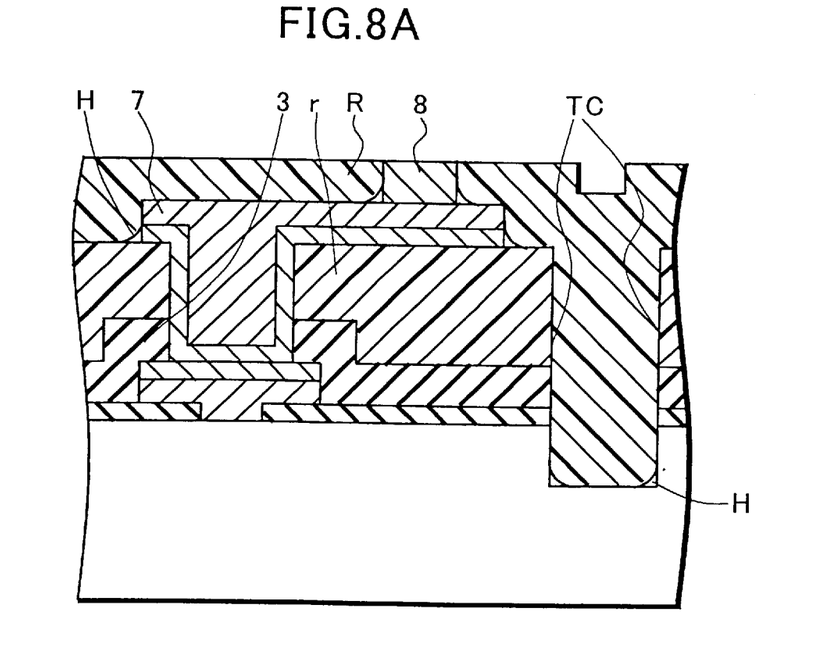
FIGS. 8A and 8B are drawings to describe the semiconductor device manufacturing method according to the embodiment of the invention.
Figure 8B:
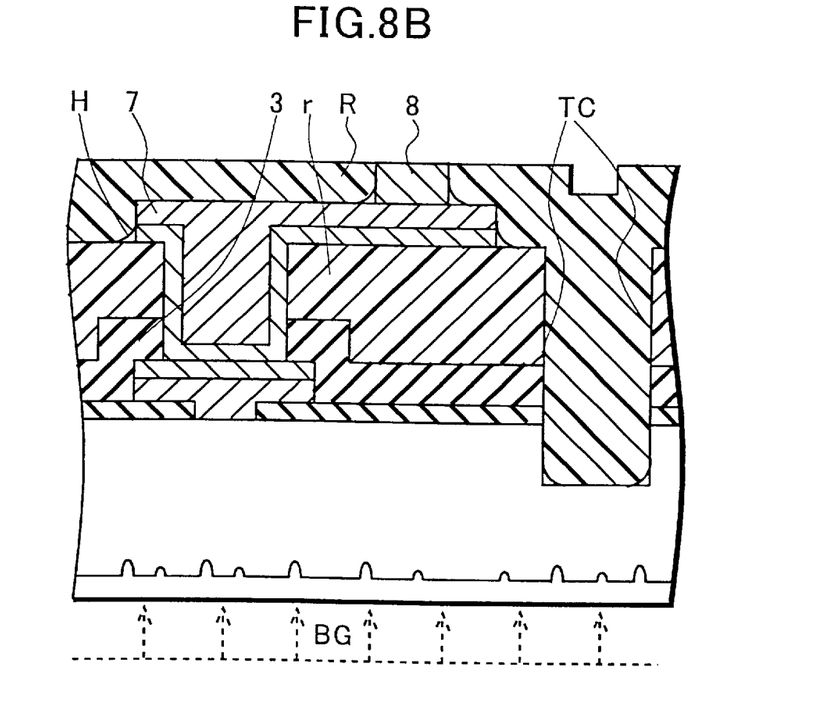
Figure 9:
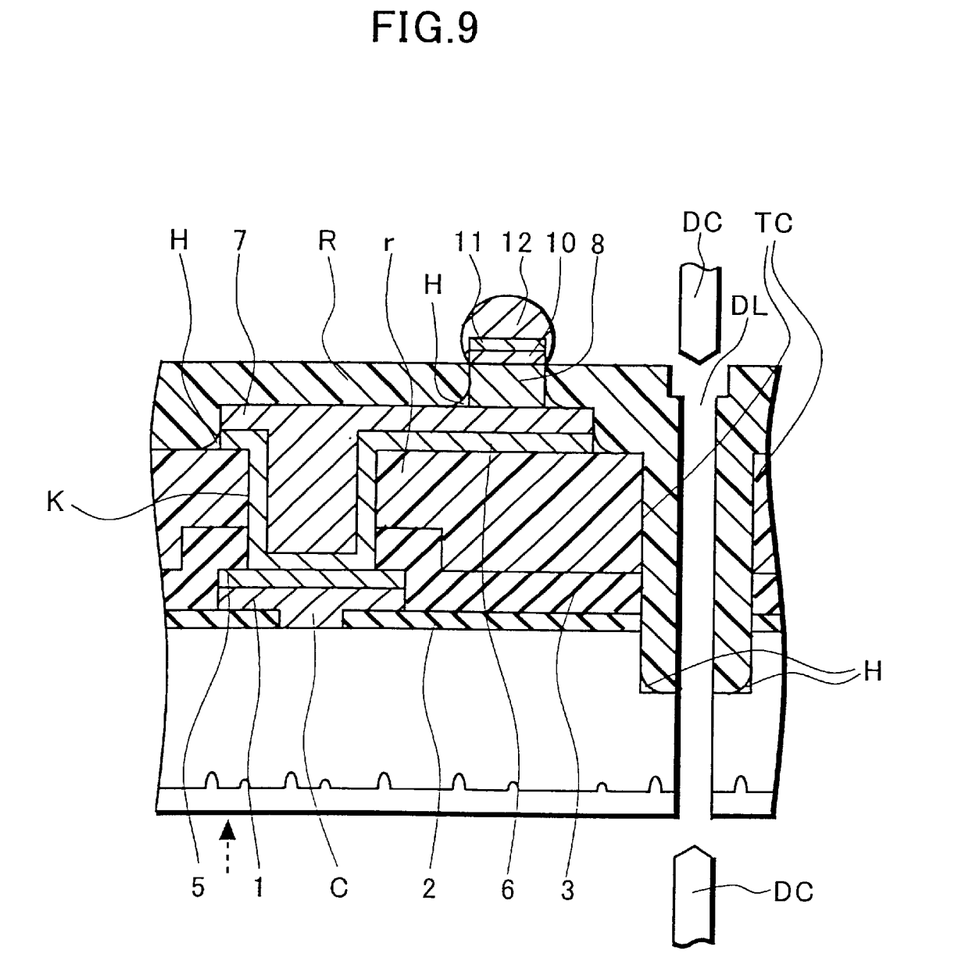
FIG. 9 is a drawing to describe the semiconductor device manufacturing method according to the embodiment of the invention.

This CSP structured semiconductor device is shown in FIG. 9 (Producing step is shown in FIGS. 1–8A or 8B), after a resin layer R is formed so as to completely cover the top of a metal post 8, the resin layer R is polished so as to expose the head of the metal post 8. Numeral 1 denotes an Al electrode, a portion of the top metal layer (also functioning as a bonding pad) in an IC chip of normal wire bonding type, and numeral 2 denotes an interlayer insulating film in which a contact hole C of the Al electrode 1 is made. The Al electrode 1 need not necessarily be made of Al and may be made of Au or Cu. The material of the Al electrode 1 is not limited if it can be bonded.

A plurality of metal layers are formed below the contact hole C and are in contact with a transistor (MOS-type or BIP-type transistor), a diffusion area, a polysilicon gate, polysilicon, or the like, for example.

The invention can also be embodied in the MOS type, the BIP type, needless to say.

The structure generally is an IC called one metal layer, two metal layers,

That is, although not shown, as the metal layers increase like two layer, three layers, . . . , the metal layers and insulating layers are formed below the interlayer insulating film 2 and their interfaces are exposed to a first groove TC described later.

Further, numeral 3 denotes a passivation film. The passivation film 3 is made of an Si nitride film, an epoxy resin, polyimide, or the like, and an insulating resin layer r is put on the passivation film 3.

Here, to adopt a resin as the passivation film, it may be made of the same material as the insulating resin layer r.

The insulating resin layer r is put by spin on, etc., with comparatively low viscosity and is left standing as described later, whereby the surface of the insulating resin layer r can be made flat. Thus, a wiring layer 7 can be made flat and the height of most of the solder balls can be made constant.

A Ti nitride film 5 is formed on the Al electrode 1.

An opening K for exposing the Ti nitride film 5 is made in the passivation film 3 and the insulating resin layer r and here, a thin film layer 6 of Cu is formed as a plate electrode (seed layer) of the wiring layer 7. The wiring layer 7 plated with Cu is formed on the Cu thin film layer 6.

A resin layer R made of a resin is formed on the chip full face containing the wiring layer 7. However, although not shown, an $Si_3N_4$ film may be placed on the interface between the resin layer R and the wiring layer 7 or the interface between the resin layer R and a metal post 8.

The resin layer R can be made of a thermosetting or thermoplastic resin; particularly an amic acid (family polyimide) film or polyimide family or epoxy family resin is preferred as the thermosetting resin. To adopt a thermoplastic resin, thermoplastic polymer (Himal manufactured by Hitachi Kasei), etc., is preferred. The amic acid film has a contraction coefficient of 30% to 50%.

Resin layer R consisting essentially of an liquid or film-like amic acid is provided and is spun on or vacuum-laminated on the wafer full face. It is about 50 to 150 μm thick. Then, the resin layer R is polymerized by thermosetting reaction at a temperature of 300° C. or more. However, the resin layer R made of amic acid before being heat-cured becomes active at the temperature and reacts with Cu, worsening the interface. However, the wiring layer surface is covered with $Si_3N_4$ film, whereby the reaction with Cu can be prevented. Here, the $Si_3N_4$ film has a thickness of about 100 to 1000 nm.

The $Si_3N_4$ film is an insulating film excellent in barrier property and an $SiO_2$ film is inferior to the $Si_3N_4$ film in barrier property. However, to adopt the $SiO_2$ film, it needs to be made thicker than the $Si_3N_4$ film. The $Si_3N_4$ film, which can be formed by a plasma CVD method, is also excellent in step coverage and is preferred. Further, after the metal post 8 is formed, the resin layer R is put. Thus, if the $Si_3N_4$ film is formed, not only the reaction of the wiring layer 7 made of Cu and the resin layer consisting essentially of amic acid, but also the reaction of the metal post 8 made of Cu and the resin layer R consisting essentially of amic acid can be prevented.

Figure 7:
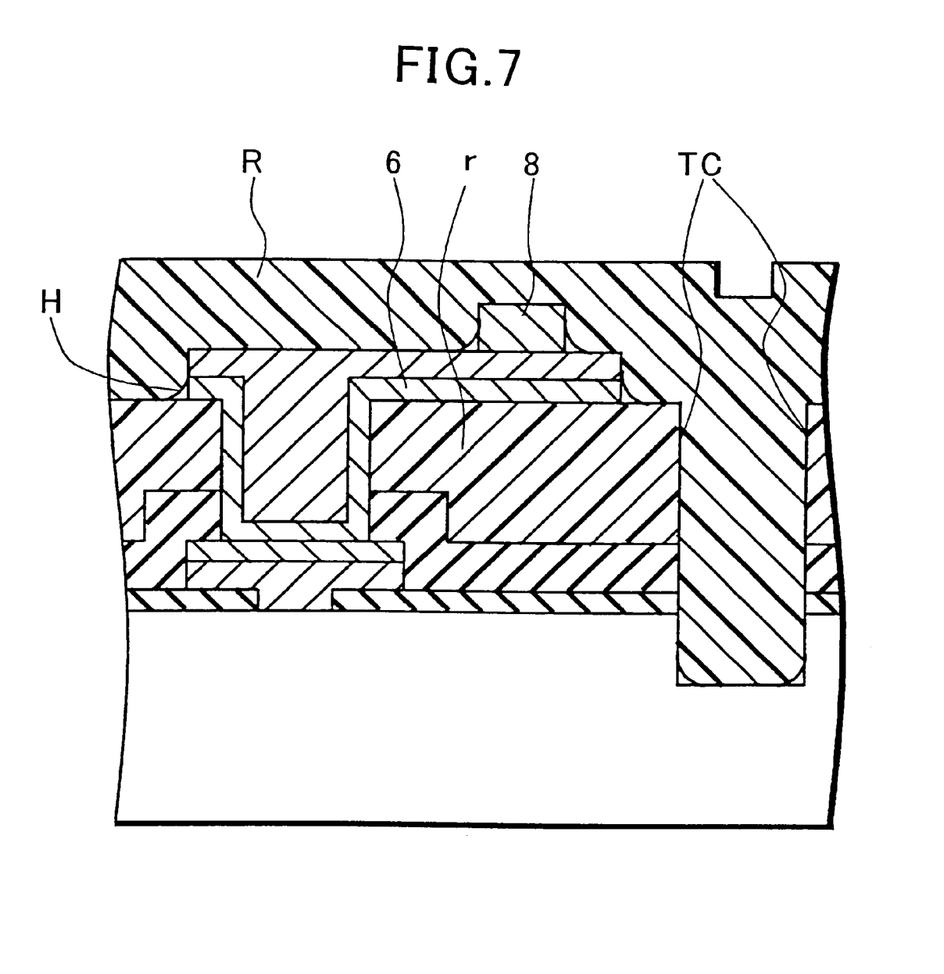
FIG. 7 is a drawing to describe the semiconductor device manufacturing method according to the embodiment of the invention.

At the time, the resin layer R is adjusted so as to be positioned above the head of the metal post 8 as shown in FIG. 7 (for example, about 20 μm to 50 μm above the head of the metal post 8). In a postprocess, a polishing step is executed to expose the head of the metal post 8.

The head of the metal post 8 is exposed at the end of the wiring layer 7 as mentioned above and barrier metal can be formed on the head of the metal post 8. Here, Ni 10 and Au 11 are formed by electroless plating.

If a solder ball is formed directly on the metal post 8 made of Cu, the connection strength to the solder ball is degraded because of oxidized Cu. If Au is directly formed to prevent oxidation, Au is diffused to the solder ball. Thus, Ni is inserted therebetween. Ni prevents oxidation of Cu and Au prevents oxidation of Ni. Therefore, degradation of the solder ball and degradation of the strength are suppressed.

A solder ball 12 is formed on the head of the metal post 8 as shown in FIG. 9.

If a resin layer having fluidity before being cured is cured, it is contracted during the curing and the film thickness is drastically decreased. This type of resin layer may be used as the resin layer R. Thus, at the curing time, the resin layer R is contracted and the surface of the resin layer R is positioned below the head of the metal post 8, exposing the metal post 8. Therefore, the resin layer R need not be removed for exposing the head. Uniform exposing of the head in the polishing step requires very difficult control, but the head can be easily exposed as the resin is contracted.

Next, the difference between the solder ball and a solder bump will be discussed. As the solder ball, ball-like solder is provided separately and is fixedly secured to the metal post 8. The solder bump is formed as a film having thickness in the beginning and is formed like a ball in a later heat treatment.

Figure 6:
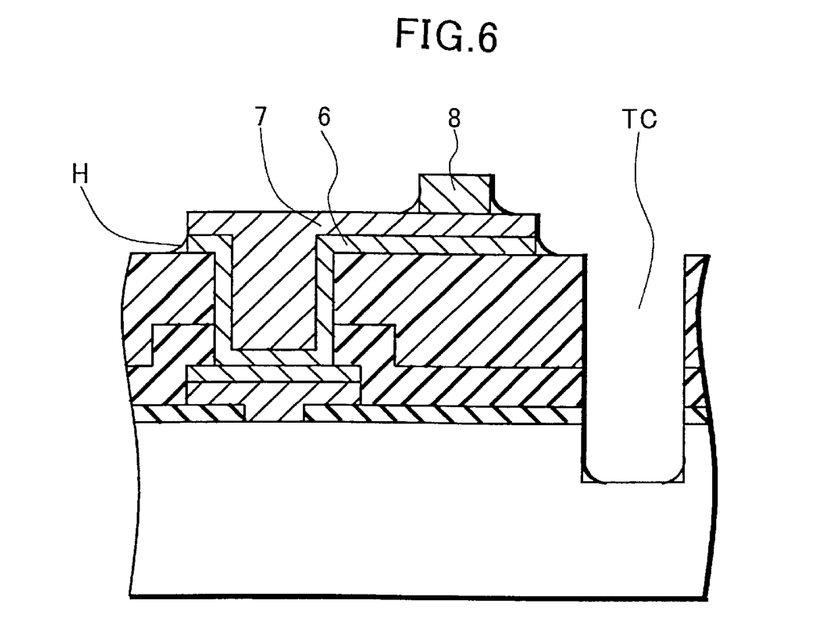
FIG. 6 is a drawing to describe the semiconductor device manufacturing method according to the embodiment of the invention.

Since the seed layer is removed in the step in FIG. 6, electrolytic plating cannot be adopted and actually a solder ball is provided.

Last, a first groove denoted by TC is formed surrounding the chips provided in a wafer state, and an insulating resin layer is embedded in the groove. Here, the same layer as the resin layer R is formed to simplify the step, but they need not be the same if simplifying the step is not considered.

The groove TC and the resin layer are fully cut by a dicing blade DC narrower than the first groove TC. That is, resin layer is placed between the first groove TC and a full cut line DL and a coat H is provided. The resin layer is formed, whereby the interface ends of the layers causing humidity resistance to be degraded can be covered with the resin layer, making it possible to prevent element degradation. The coat H is formed, whereby formation of a gap (also called a gravity) easily formed in the edge of the place where the metal post 8 abuts the wiring layer 7 (indicated by reference symbol H in FIG. 9) can be prevented although the description with reference to figure is not given. The gap is formed because the resin layer R does not reach the depth of the edge H. Thus, if coat H made of low-viscosity SOG or resin is applied to the wafer full face, the edges can be made smooth. Thus, if the resin layer R is then put, voids can be prevented from occurring.

Further, the coat H is also formed in the first groove TC and particularly a plurality of interfaces are exposed on the side walls of the first groove TC, so that the interfaces can be covered with the coat H; environmental resistance of the chips can be enhanced together with the resin layer R.

Figure 1:
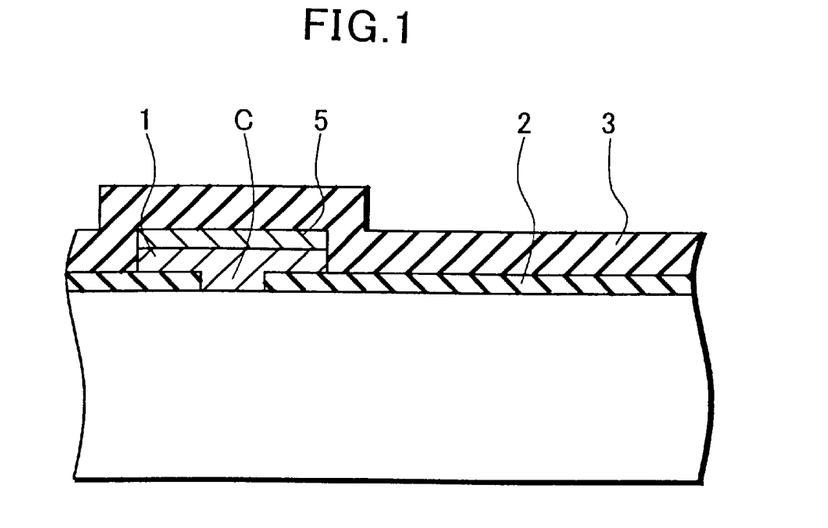
FIG. 1 is a drawing to describe a semiconductor device manufacturing method according to an embodiment of the invention.

Subsequently, a manufacturing method of the structure in FIG. 9 will be discussed with reference to FIG. 1.

First, a semiconductor substrate (wafer) formed with LSIs like a matrix each having the parts of up to the Al electrode 1 is provided. Here, as described above, IC comprising one metal layer, two metal layers, . . . is formed with transistor source electrode and drain electrode as the first metal layer and Al electrode 1 in contact with the drain electrode as the second metal layer, for example.

Here, opening C in interlayer insulating film 2 where the drain electrode is exposed is formed, then electrode material consisting mainly of Al, Ti nitride film 5, is formed on the full wafer face and the Al electrode 1 and the Ti nitride film 5 are dry-etched to a predetermined shape with photoresist as a mask.

Here, unlike the case where passivation film 3 is formed and then barrier metal is formed from above the opening C, formation can be executed at a time with the photoresist (also containing the Ti nitride film as barrier metal), making it possible to reduce the number of steps.

The Ti nitride film 5 also functions as barrier metal of Cu thin film layer 6 later formed. Moreover, attention is also focused on the fact that the Ti nitride film is effective as a reflection prevention film. This means that the Ti nitride film is also effective as an antihalation film of a resist used at the patterning time. As antihalation, at least about 1200 A to 1300 A is required; to provide a barrier metal function as well as the antihalation function, about 2000 A to 3000 A is preferred. If the film is formed thicker than the value, a stress is caused by the Ti nitride film. Since the Ti nitride film has poor adhesion to resin, contact with resin layer r is not preferred.

After the Al electrode 1 and the Ti nitride film 5 are patterned, the full face is covered with passivation film 3. Here, an $Si_3N_4$ film is adopted as the passivation film, but polyimide, etc., is also possible. (See FIG. 1)

Figure 2:
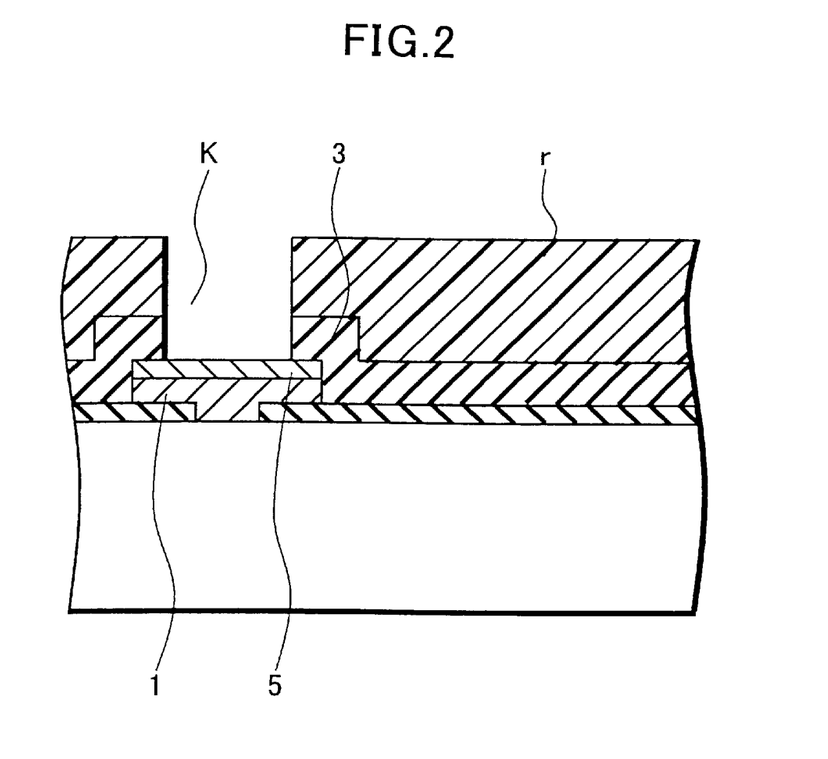
FIG. 2 is a drawing to describe the semiconductor device manufacturing method according to the embodiment of the invention.

Subsequently, the surface of the passivation film 3 is covered with insulating resin layer r. Here, a positive photosensitive polyimide film is adopted as the insulating resin layer r and is formed about 3 to 5 μm thick. Opening K is made.

Adopting the photosensitive polyimide film eliminates the need for separately forming photoresist and making the opening K in patterning of the opening K in FIG. 2, and the step can be simplified by adopting a glass photomask, metal mask. Of course, photoresist can also be adopted.

Moreover, the polyimide film is also adopted for the purpose of flattening. That is, for the heights of solder balls 12 to be uniform in all regions, the heights of metal posts 8 also need to be uniform in all regions, and wiring layer 7 also needs to be formed flat with accuracy. Thus, polyimide resin is applied and the resin, which has fluidity having one viscosity, is left standing for any desired time before it is cured, whereby the surface can be made flat.

Here, the Al electrode 1 also serves as an external connection pad of the LSI. When formation as a chip size package comprising a solder ball (solder bump) is not executed, the Al electrode 1 functions as a wire bonding pad. (See FIG. 2.)

Figure 3:
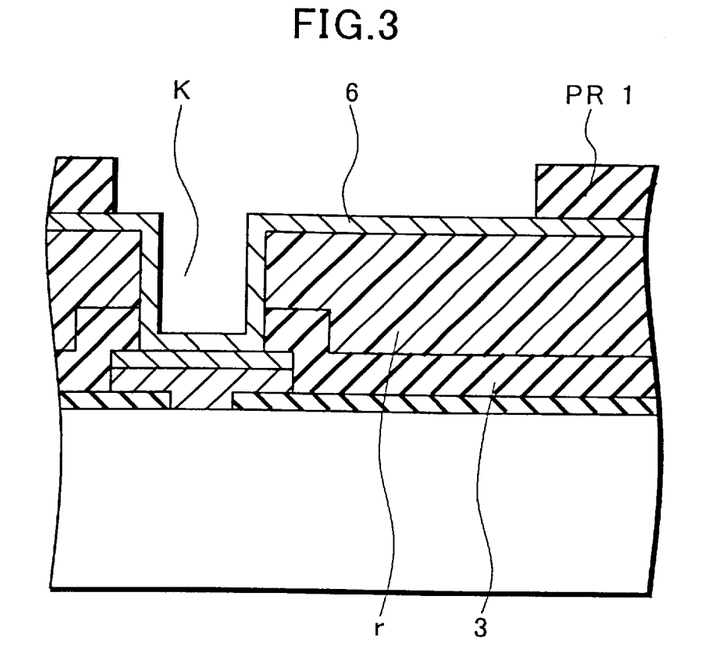
FIG. 3 is a drawing to describe the semiconductor device manufacturing method according to the embodiment of the invention.

Subsequently, Cu thin film layer 6 is formed on the full face. The Cu thin film layer 6 will become a plate electrode of wiring layer 7 later; for example, it is formed as a film thickness of about 100 to 200 nm by sputtering.

Subsequently, for example, a photoresist layer PR1 is applied to the full face, and the photoresist layer PR1 corresponding to the wiring layer 7 is removed. (See FIG. 3) Subsequently, with the Cu thin film layer 6 exposed to the opening of the photoresist PR1 as a plate electrode, the wiring layer 7 is formed. The wiring layer 7 needs to be made thick about 2 to 5 μm to provide a mechanical strength. Here, it is formed using a plating method, but may be formed using evaporation, sputtering, etc. To adopt evaporation or sputtering, no seed layer is required and thus the Cu thin film layer 6 is unnecessary.

Figure 4:
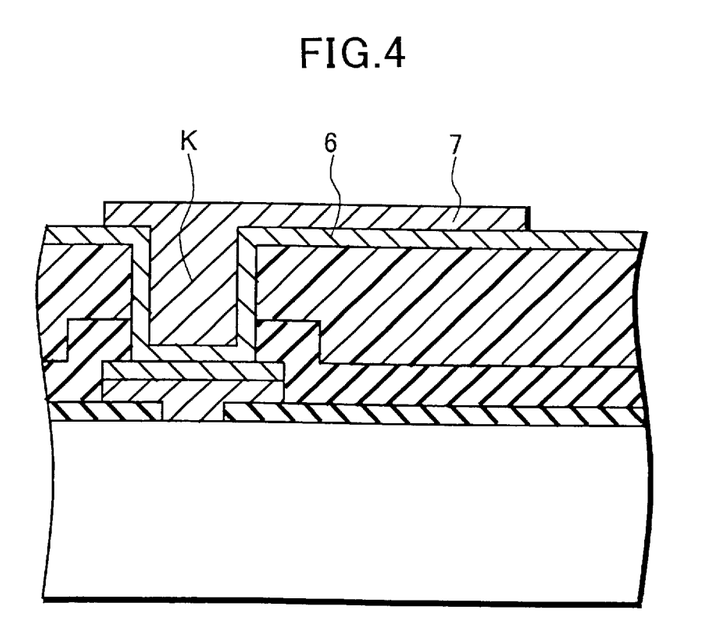
FIG. 4 is a drawing to describe the semiconductor device manufacturing method according to the embodiment of the invention.

Then, the photoresist layer PR1 is removed. (See FIG. 4.)

Figure 5:
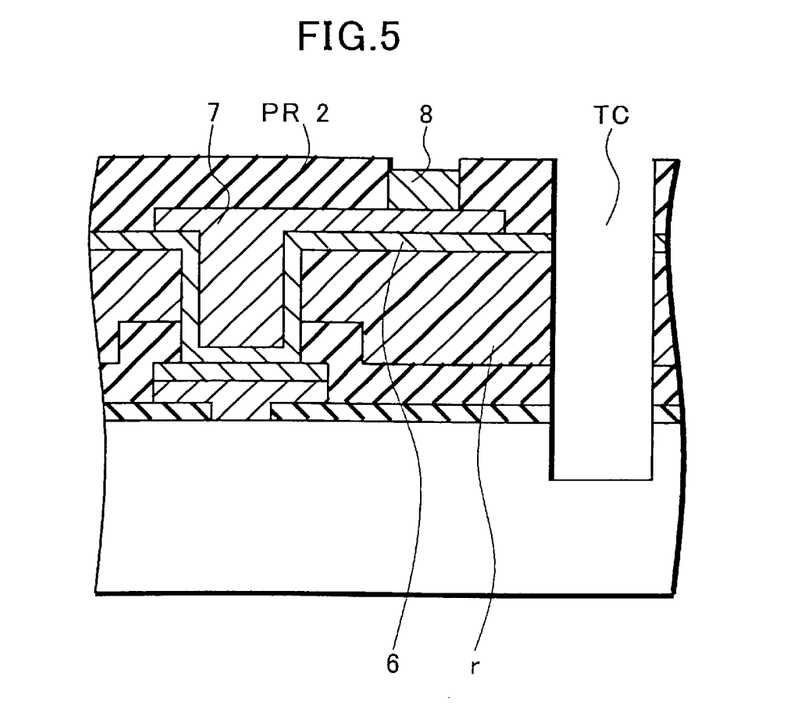
FIG. 5 is a drawing to describe the semiconductor device manufacturing method according to the embodiment of the invention.

Subsequently, a photoresist PR2 where an area where metal post 8 is formed is exposed is formed, and the Cu metal post 8 is formed in the exposure area by electrolytic plating. In this case, the Cu thin film layer 6 is also utilized as a plate electrode. The metal post 8 is formed in a height of about 30 to 150 μm, The height of the metal post 8 is adjusted based on a thermal expansion coefficient of a mount board onto which the chip size package is fixedly secured. That is, as the post is higher, it can absorb the mount board stress caused by expansion.

Here, sputtering is also possible as any other method than electrolytic plating.

Here, first groove TC can be formed at various timings; the timing after the metal post is formed is possible as the first timing. Here, if the photoresist PR2 is formed with a formation plan line of the first groove TC, dicing can be executed along the plan TC exposure portion. If another photoresist for exposing only the first groove TC is formed, either etching or dicing can be used for formation.

Subsequently, the photoresist PR2 is removed and the Cu thin film layer 6 is removed with the wiring layer 7 as a mask. A low-viscosity SOG film or liquid-like resist is formed on the wafer full face by spin on, for example. At this time, edges where voids are easily formed are formed with coat H for smoothing the edges. The interface exposed on the side wall of the first groove TC is also covered with an extremely thin film.

Here, spin on is adopted as an easy manufacturing method, but an $SiO_2$ film or a TEOS film may be formed by a plasma CVD method capable of forming a film at low temperature and may be etched back. (See FIG. 6.)

An Si3N4 film may be put on the full surface containing the wiring layer 7 and the metal post by the plasma CVD method before the coat H is formed.

Cu and the pre-cured coat H formed in a later step react with each other by heat. Thus, the interface therebetween is degraded. Therefore, the wiring layer 7 and the metal post 8 need to be all covered with the $Si_3N_4$ film. If degradation of the interface does not occur, the $Si_3N_4$ film can be omitted, of course.

If the $Si_3N_4$ film is formed after the metal post 6 is formed, the wiring layer 7 and the metal post 8 can be covered. Patterned and exposed side M needs to be protected together; here, both are patterned and then the $Si_3N_4$ film is put, so that the side M is protected together.

As described above, the formation timing of the first groove TC may be after the Si3N4 film is formed.

That is, since the full face is protected by the $Si_3N_4$ film, the first groove TC can be diced or etched in the state. Since the $Si_3N_4$ film is formed on the wafer full face, oxidation of the metal post 8 can be prevented.

If the $Si_3N_4$ film is not provided, the first groove TC needs to be formed before resin layer R is put because of the necessity for embedding the resin layer R in the first groove.

Subsequently, the resin layer R is applied onto the full face. At this time, the resin layer R is formed so as to completely cover the top of the metal post 8 as shown in FIG. 7 (for example, about 20 μm to 50 μm above the head of the metal post 8), and a polishing step of a postprocess is executed to polish the resin layer R for exposing the head of the metal post 8.

The invention is characterized by the polishing step and further the treatment timing.

That is, in a first method, the resin layer R formed so as to completely cover the top of the metal post 8 is polished until the head of the metal post 8 is exposed, for example, using a CMP unit, as shown in FIG. 8A.

Thus, the resin layer R is once formed so as to completely cover the top of the metal post 8 and then the head of the metal post 8 is exposed, so that the process control is facilitated as compared with the process of controlling so that the head of the metal post 55 is exposed when resin sealing is executed as in the related art.

That is, the need for forming the heights of the metal posts 8 uniformly so as to prevent variations in the heights of the metal posts 55 as in the related art is eliminated and the process control is easy. In the polishing step of a postprocess, the heads of the metal posts 8 are also polished together with the resin layer R and the heights of the metal posts 8 become uniform. Of course, control may be performed so that formation is executed so as to make the uniform heights of the metal posts 8 and that the polishing terminates at the heads of the metal posts 8 (or a slightly cut state). In the postprocess, the wafer surface is covered with a protective sheet (not shown) and back grinding is executed as indicated by the dotted line arrow for thinning the wafer. (See FIG. 9.)

In a second method, as shown in FIG. 8B, first the wafer rear face is back ground, then the resin layer R formed so as to completely cover the top of the metal post 8 is polished until the head of the metal post 8 is exposed, for example, using a CMP unit.

Thus, after the wafer rear face is back ground, the head of the metal post 8 is exposed, so that film thickness variations can be reduced as compared with the first method. That is, after the back grinding step is executed, the polishing step of exposing the head of the metal post 8 is executed, so that the film thickness variations of the wafer of the initial material can be suppressed and the reliability at the mounting (packaging) time is more enhanced. Since the surface is ground as it is coated with resin, protective tape need not be put and it is made possible to prevent contamination on the metal post surface.

If the coat H and the $Si_3N_4$ film are formed on the metal post 8, they are also polished in the polishing step of the resin layer R. Further, the film thickness variations of a widely used wafer at present are about 20 μm and moreover the polishing accuracy is also about 5 μm. Considering the variations, the resin layer R is formed once so as to completely cover about 20 μm to 50 μm above the head of the metal post 8, as described above. In the embodiment, it is sufficient if about 20 μm.

The wafer in the state in FIG. 6 is mounted on metal mold 60, 61, 62 and the resin layer R may be pressed and sealed by means of the metal mold, as shown in FIG. 12. In this case, a sheet 64 having very small adhesion is provided considering the peel property.

Also in this case, the resin layer R is formed so as to completely cover the top of the metal post 8 and then is polished using a CMP unit until the head of the metal post 8 is exposed, as described above.

To form the resin layer R, a resin layer having fluidity in the beginning and having a film thickness largely decreased upon completion of thermosetting reaction is used, whereby a flat proper can be provided before the resin layer is cured because it has fluidity in the beginning, and to cure the resin layer, it can also be formed so that it is positioned below the head of the metal post because the film thickness is decreased. In this case, the polishing step becomes unnecessary. Thus, also to adopt resin with a sheet, unlike control performed so that in resin sealing, when the sheet 64 for peeling off is peeled off, the head of the metal post 8 is just exposed, it is used only for the purpose of facilitating peeling off from the metal mold, thus the need for considering selection of the sheet 64 for peeling off (containing elasticity), etc., is eliminated and normal sheet 64 can be used.

The insulating resin layers R and r have the following advantages:

Generally, if a viscous resin is applied by a dispenser, bubbles are taken in although deaeration is executed. If sintering is executed with bubbles taken in, the bubbles will burst in a later step or in a high-temperature atmosphere used by the user.

In the process, resin is applied by spin on and the viscosity is adjusted so that the film can be formed as a film thickness of about 20 to 30 $\mu$m by one spin. As a result, the bubbles larger than the film thickness are broken and disappear because the film is thin. The bubbles smaller than the film thickness are blown off to the outside together with the resin blown off to the outside by the centrifugal force of the spin on, and a film with no bubbles can be formed.

The insulating resin layer R requires a film thickness of about 50 $\mu$m to 100 $\mu$m. In this case, the above-described principle is adopted, resin is applied more than once by spin on, and the insulating resin layer R can be formed while bubbles are removed.

Of course, application may be executed using a dispenser without adopting spin on.

Further, the insulating resin layer R has the advantage that it is contacted when it is cured. Generally, a resin is contracted to some extent after it is cured. However, the insulating resin layer R is contacted during baking, and the surface of the insulating resin layer R is positioned below the head of the metal post 8. Therefore, the head of the metal post 8 is exposed and thus a solder ball can be fixedly secured.

To enhance the strength of the solder ball, the exposure percentage containing the sides of the metal post 8 needs to be enlarged; the application amount of the insulating resin layer R is controlled, whereby the exposure percentage can be controlled.

After it is cured, an extremely thin film may remain on the head of the metal post 8, in which case the surface may be polished or plasma-ashed simply. Particularly, as described above, the heights of the metal posts are uniform, thus if a flat polishing plate is used, all heads can be cleaned.

After the insulating resin layer R is put, it may be semi-cured to such an extent that it can be polished, then the insulating layer R may be polished to the proximity of the head of the metal post 8 before it is completely cured. In this case, only an extremely thin film is left on the head of the metal post 8. Thus, if the insulating resin film R has a small contraction coefficient, the metal post can be exposed as the insulating resin film is contracted. That is, the film thickness that can be placed on the metal post 8 is determined by the contraction coefficient of the resin, thus polishing, no polishing, or the degree of polishing if polishing is executed may be determined in accordance with the film thickness, and the metal post may be exposed.

If the coat H, the $Si_3N_4$ film is formed, the film is formed on the head of the metal post, in which case it is removed by wet etching, dry etching, or polishing.

Further, the top of the metal post 8 is plated with Ni 10 and Au 11 as shown in FIG. 9. Here, the Cu thin film layer 6 is removed with the wiring layer 7 as a mask, thus electroless plating is adopted for forming Ni about 1 to 5 $\mu$m thick and Au 10 about 100 to 1000 nm thick.

Since Ni and Au are thus formed after the metal post head is polished, reliability is enhanced as compared with the process of polishing after forming Ni and Au on the metal post. That is, Au is in the top layer with a film thickness of about 100 to 1000 nm and thus if flat polishing is not accomplished, Au appears on one post, the insulating resin layer is put on Au on another post, and Au is cut on another post. That is, Au also serves as prevention of oxidation, thus a place where a solder ball is fixedly secured, a place where a solder ball is weakly secured, and a place where a solder ball is not secured occur.

Further, in the first method of the invention, the wafer surface is covered with a protective sheet and is back ground as indicated by the dotted line arrow for thinning the wafer, as described above. (See FIG. 9.)

In the second method, the back grinding step is already finished completely. (See FIG. 8B.) Last, provided solder balls are registered and mounted, then reflowing is executed. (See FIG. 9.) The semiconductor substrate is divided along a scribe line in a dicing step to complete chip size packages.

The timing at which the solder is fused is before dicing.

At the timing, a dicing blade DC narrower than the first groove TC is provided and is used to fully cut almost at the center of the first groove. The first groove TC is provided by half cutting arriving at the semiconductor substrate, for example. Thus, the interface ends of the layers formed above the semiconductor substrate are protected by the coat resin H and the resin layer R and become CSP.

For the chip size package provided in FIGS. 12 and 13, an extremely thin wafer is placed in the metal mold and the resin 63 is pressed and sealed. However, if small particles exist on the wafer rear face, the wafer is broken with the particle as a supporting point. However, this problem is eliminated if the resin layer R is formed by spin on.

As described above, in the invention, first, the resin layer R is formed so as to completely cover the top of the metal post and then is polished so as to expose the head of the metal post 8. Thus, the process control is facilitated as compared with the process of controlling so that the head of the metal post is exposed when resin sealing is executed as in the related art.

Second, after the wafer rear face is back ground, the resin layer R formed so as to completely cover the top of the metal post is polished so as to expose the head of the metal post 8. Thus, as compared with the first method, film thickness variations can be reduced and the reliability at the mounting (packaging) time is more enhanced.

In the invention, the resin layer R formed so as to completely cover the top of the metal post is not limited to mold resin sealed in a metal mold and may be spin-coated polyimide or a liquid epoxy family resin. Further, it may be an amic acid family polyimide film put into polyimide by laminating and pure baking.

According to the invention, first, the resin layer is formed so as to completely cover the top of the metal post and then is polished so as to expose the head of the metal post. Thus, the process control is facilitated as compared with the process of controlling so that the head of the metal post is exposed as in the related art.

Second, after the wafer rear face is back ground, the resin layer formed so as to completely cover the top of the metal post is polished so as to expose the head of the metal post. Thus, as compared with the first method, film thickness variations can be reduced and the reliability at the mounting (packaging) time is more enhanced.

Further, according to the invention, thirdly, the edges formed in the surroundings of the abutment part of the metal post and its lower layer are formed with a coat for smoothing the edges, so that voids can be prevented from occurring.

Fourth, a coat is provided for smoothing the edges formed in the surroundings of the abutment part of the metal post and its lower layer and the coat is further provided between a resin layer for covering side walls surrounding a chip and edge formed at side wall bottom, so that voids formed in the first dicing groove can also be suppressed.

Fifth, if the coat is formed so as also to cover an interface exposed to the side wall, water vapor, etc., entering the interface can be blocked and excellent environmental resistance can be provided.

Sixth, the wiring layer made of metal abuts the metal post lower layer and the coat is also put on the edges formed in the surroundings of the abutment part of the wiring layer and its lower layer, whereby the interface between the wiring layer and its lower layer can be covered, and more excellent environmental resistance can be provided.

Seventh, the coat can be realized by a very simple method with a material that can be spun on, so that costs can be reduced increasingly.

What is claimed is:

1. A manufacturing method of a semiconductor device comprising a metal post contacted to an electrode of LSI, resin covering surroundings of the metal post, and a solder ball or a solder bump connected to the metal post, said method comprising the steps of:

forming a layer of the resin so as to completely embed the metal post; and polishing the resin layer so as to expose the head of the metal post.

2. A manufacturing method of a semiconductor device comprising a metal post contacted to an electrode of LSI, resin covering surroundings of the metal post, and a solder ball or a solder bump connected to the metal post, said method comprising the steps of:

forming a layer of the resin over and surrounding the metal poet;

back grinding a wafer rear face; and polishing the resin layer so as to expose the head of the metal post, which is thereby made flush with the surrounding resin layer.

3. The manufacturing method as claimed in claim 1, wherein the resin layer formed so as to completely cover the top of the metal post is about 20 $\mu$m to 50 $\mu$m thick above the top of the metal post.

4. The manufacturing method as claimed in claim 1, wherein said step of forming the resin layer so as to completely cover the top of the metal post is a mold step using a metal mold.

5. The manufacturing method as claimed in claim 1, wherein said step of forming the resin layer so as to completely cover the top of the metal post is a spin coating step of a polyimide resin.

6. The manufacturing method as claimed in claim 1, wherein said step of forming the resin layer so as to completely cover the top of the metal post is a step of applying a liquid epoxy family resin.

7. The manufacturing method as claimed in claim 1, wherein the resin layer formed so as to completely cover the top of the metal post is a laminated film.

8. The manufacturing method of a semiconductor device as claimed in claim 1 further comprising:

plating the exposed metal post with Ni and Au.

9. The manufacturing method of a semiconductor device as claimed in claim 8, wherein the plated Ni layer has a thickness of about 1 to 5 $\mu$m and the plated Au layer has a thickness of about 100 to 1000 nm.

10. The manufacturing method of a semiconductor device as claimed in claim 2 further comprising:

plating the exposed metal post with Ni and Au.

11. The manufacturing method of a semiconductor device as claimed in claim 10, wherein the plated Ni layer has a thickness of about 1 to 5 $\mu$m and the plated Au layer has a thickness of about 100 to 1000 nm.

12. A manufacturing method of a semiconductor device comprising a metal post contacted to an electrode of LSI, resin covering surroundings of the metal post, and a solder ball or a solder bump connected to the metal post, said method comprising the steps of:

forming a layer of the resin over and surrounding the metal post;

back grinding a wafer rear face;

polishing the resin layer so as to expose the head of the metal post, which is thereby made flush with the surrounding resin layer;

plating the exposed metal post with Ni and Au.

13. The manufacturing method of a semiconductor device as claimed in claim 12, wherein the plated Ni layer has a thickness of about 1 to 5 $\mu$m and the plated Au layer has a thickness of about 100 to 1000 nm.

* * * * *